United States Patent [19]

Li

[11] 4,136,435

[45] Jan. 30, 1979

[54] METHOD FOR MAKING SOLID-STATE DEVICE

[76] Inventor: Chou H. Li, 379 Elm Dr., Roslyn, N.Y. 11576

[21] Appl. No.: 764,433

[22] Filed: Jan. 31, 1977

Related U.S. Application Data

[63] Continuation of Ser. No. 405,138, Oct. 10, 1973, abandoned, and Ser. No. 580,414, May 23, 1975, each is a continuation-in-part of Ser. No. 190,483, Oct. 19, 1971, Pat. No. 3,765,956, and Ser. No. 386,102, Aug. 6, 1973, and Ser. No. 802,018, Feb. 25, 1969, Pat. No. 3,500,135, which is a continuation-in-part of Ser. No. 490,955, Sep. 28, 1965, Pat. No. 3,430,109, said Ser. No. 190,483, is a continuation-in-part of Ser. No. 868,129, Oct. 21, 1969, abandoned, which is a continuation-in-part of Ser. No. 491,718, Sep. 30, 1965, abandoned.

[51] Int. Cl.² ............................................. H01L 21/18
[52] U.S. Cl. .................................. 29/572; 148/1.5; 148/33; 148/134
[58] Field of Search .................. 148/1.5, 33, 173, 186, 148/187, 134 G, 134 S, 134 R; 357/55, 59; 75/65 ZM; 29/572

[56] References Cited

U.S. PATENT DOCUMENTS

| | | | |
|---|---|---|---|
| 2,795,742 | 6/1957 | Pfann | 148/33 X |
| 2,813,048 | 11/1957 | Pfann | 148/1.5 X |
| 3,100,276 | 8/1963 | Meyer | 148/175 X |
| 3,124,452 | 3/1964 | Kraft | 75/135 |
| 3,226,225 | 12/1965 | Weiss et al. | 75/134 R |
| 3,267,405 | 8/1966 | Weiss et al. | 148/1.5 X |
| 3,430,109 | 2/1969 | Li | 357/50 X |
| 3,434,827 | 3/1969 | Lemkey | 75/135 X |
| 3,500,135 | 3/1970 | Li | 357/55 X |
| 3,648,125 | 3/1972 | Peltzer | 148/175 X |
| 3,765,956 | 10/1973 | Li | 148/1.5 X |

Primary Examiner—G. Ozaki

[57] ABSTRACT

The ultra-miniaturized, active solid-state devices and circuitries have unique material bodies having signal-translating regions attached thereto for active signal translation. These regions, comprising melt-grown, or simulated melt-grown, metallurgical compounds including oxides, eutectics, and intermetallics, are of controlled compositions, concentration profiles, and electronic or other optoelectromagnetic properties. In some devices, the microstructure of the compounds comprises a plurality of microscopically thin, regularly-shaped and uniformly-spaced bodies of one phase material dispersed in a matrix of another phase material. The electronic conductivity of the bodies is substantially different from that of the matrix, and the bodies all terminate at microscopic distance from the pn junction (or other interfacial rectifying barrier region), so as to confine the signal current carriers to flow mainly in only one of the phases. This achieves carriers microstreaming or microbranching effects. Described also herein are different devices including micron-size eutectic devices, dendritic devices, cellular devices, and granular devices; and their methods of manufacture. The barrier regions may be further modified by diffusion, ion implantation, selective oxidation, electrolytic etching, and surface-contouring. In addition, selected circuit elements may be embedded into these devices to achieve additional carriers movement control or to obtain special beneficial effects.

17 Claims, 18 Drawing Figures

METHOD FOR MAKING SOLID-STATE DEVICE

This is a continuation of my pending applications Ser. Nos. 405,138 and 580,414, filed Oct. 10, 1973 and May 23, 1975, respectively, Both of which are continuations-in-part of applications Ser. Nos. 190,483, 386,102, and 802,018, filed Oct. 19, 1971, Aug. 6, 1973, and Feb. 25, 1969, respectively. The 190,483 application is a continuation-in-part of application Ser. No. 868,129 filed Oct. 21, 1969 which, in turn, is a continuation-in-part of application Ser. No. 491,718 filed Sept. 30, 1965. The 802,018 application is a continuation-in-part of application Ser. No. 490,955 filed Sept. 28, 1965. The 405,138, 868,129, and 491,718 applications are now abandoned while the 190,483, 802,018, and 490,955 applications have since matured into U.S. Pat. Nos. 3,765,956, 3,500,135, and 3,430,109, respectively. I hereby incorporate all these related applications by reference.

BACKGROUND OF THE INVENTION

The invention relates to solid-state devices, and more particularly to melt-grown solid-state devices having unique structures and/or operating characteristics.

These solid-state devices include semiconductor, photoelectric, electroluminescent, laser, and many other optoelectromagnetic devices.

For simplicity, the invention is described mostly in connection with a semiconductor device having a signal-translating or modulating barrier region that comprises a pn junction. It is to be noted that other types of barrier regions, including those comprising Schottky barriers interfacial rectifying barriers, metal-oxide junctions, or in general, any regions capable of active electronic signal translation or modulation, by means of controlled flow and interaction therein of electronic carriers in the form of electrons and holes, of input optoelectromagnetic signal of a prescribed kind into the desired, translated or modulated, output signal. Active signal translation is typified by the action of semiconducting diodes and transistors, in sharp contrast to those of such passive components as resistors, capacitors, and inductances.

The semiconductor diode, for example, comprises the well-known pn junction that is capable of selectively and alternately allowing and substantially blocking the flow of electronic signal current carriers in accordance with the type of the signal applied thereto for translation. Specifically and as an example, electronic current flow easily under forward bias, but is substantially blocked under reverse bias, the conductance differing by over $10^3$ times in the two states.

The material or materials making up the barrier region will be hereinafter called (solid-state) device materials. These include not only semiconductor, photoelectric, thermoelectric, electroluminescent, ... substances; but also dopants; carriers life-time controllers; carriers flow path controllers; and eutectic or dendriticforming or modifying substances for eutectic, cellular, granular, or dendritic devices. In addition, these device materials also include such substances as those that improve the characteristics of the barrier region in operation or during manufacture. For example, substances that enhance selective diffusion, oxidation, etching, or shaping of the barrier region are also considered as "device materials." On the other hand, the device materials do not include the substances for resistors, capacitors, inductances, and contacts, which are not an essential part of the signal-translating barrier region.

Existing solid-state device requires fairly complicated and expensive processing procedures to manufacture. The first step in a typical device manufacture is to grow a single crystal from a seed, by the Czochralski method as described by, for example, Clarke and Tomono in their U.S. Pat. (Nos. 2,778,198 and 3,192,082). Both ends of the resultant crystal are discarded and only the central portion of the crystal is sliced into thin wafers, which are then carefully ground and polished. Next come such critical steps as cleaning, diffusion, oxidation, rediffusion, plating, chemical etching, and metallization, ..., with numerous tests sandwiched in between. The finished wafer, if good, is then diced into chips to be mounted, contacted, and canned. It is no wonder that the yield is often low, not infrequently zero in cases of large-scale, integrated circuitries.

In addition, the existing devices, even in integrated circuits, are relatively bulky and heavy, and consume much power to operate. Further, they are often slow in responses because of their large sizes; expensive in costs; and unreliable in operations.

SUMMARY OF THE INVENTION

In summary, the solid-state devices and circuitries of this invention have signal-translating, barrier regions comprising metallurgical compounds such as oxides, eutectics, and intermetallics of substantially constant stoichiometric compositions. In some devices, the microstructure of the compounds comprises a plurality of microscopically thin bodies of one phase dispersed in a matrix of another. The electronic conductivity of the bodies is substantially different from that of the matrix, and the bodies are shaped, sized, spaced, oriented, and positioned with respect to the pn junction so as to confine the flow of carriers mainly into microscopically thin streams, thereby improving device uniformity and reliability. Also described are the structures and methods for manufacture of such devices as micron-sized eutectic devices, dendritic devices, cellular devices, and granular devices.

Accordingly, an important object of the invention is to achieve solid-state devices having improved operating characteristics.

A further object is to achieve solid-state devices which are smaller in sizes, lighter in weights, faster in responses, lower in costs and power consumptions, and more reliable in operations than conventional devices.

Yet another object is to make, by controlled melt freezing or otherwise, solid-state devices having barrier regions of controlled shapes, compositions, concentration profiles, and electrical or other properties.

Yet another object is to make solid-state devices that are responsive to external magnetic fields.

A still another object is to obtain new devices displaying the microstreaming or microbranching type of carriers flow characteristics that avoid many types of thermal failures.

Another object is to obtain integrated optical devices such as electrically isolated optical source/modulator/detector devices in discrete or array forms.

Another object is to obtain novel, self-insulated, optoelectrical devices, including complementary diodes, laser arrays, self-aligned miniature light-emitters and collectors or light-emitters and phototransistors, optoelectrical logic and memory devices, and black-and-white or multi-color, flat television panels.

Further objects and advantages of my invention will appear as the specification proceeds.

DESCRIPTION OF THE DRAWING

To illustrate the invention, there is shown in the drawings the forms which are presently preferred. It is understood, however, that this invention is not necessarily limited to the precise arrangements and instrumentalities here shown.

DESCRIPTION OF THE PREFERRED EMBODIMENTS

Figure 1:
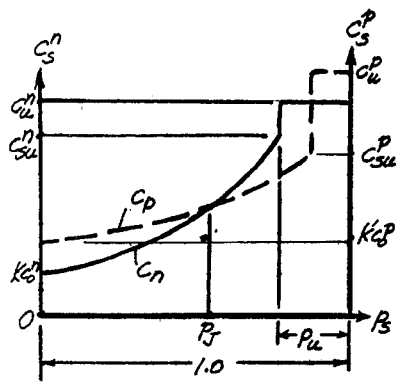
FIG. 1 shows the general concentration profiles of melt-grown crystals and the technique of producing pn junctions in these crystals by employing melt-segregating dopants of both types in controlled amounts.

The solute concentration profile (i.e., $C_s$ vs $p_s$) in the crystal grown from the Czochralski technique by, for example, Clarke and Tomono (See U.S. Pats. Nos. 2,778,198 and 3,192,082) can be calculated for any segregation coefficient k and initial solute concentration $c_o$, as shown in FIG. 1 where the symbol C denotes concentration, the subscript s denotes the solid, the subscript u denotes the eutectic (at growth temperature), the subscript o refers to initial conditions, the superscripts p and n refer to p-type and n-type dopants, respectively, and the symbol K' refers to effective segregation coefficient. For example, the notation $C_s^p$ denotes the concentration of p-type dopant in the solid, the notation $C_{su}^p$ denotes the concentration of p-type dopant in the solid at eutectic growth temperature, and the notation $K'C_o^p$ denotes the product of effective segregation coefficient of p-type dopant at the initial concentration of p-type dopant in the original melt. In this figure, the donor concentration, for Sb, for example ($K_{Sb}=0.003$) as shown in solid line $c_n$, is initially (i.e., $p_s=0$) $kc_o^{Sb}$, but rises continuously with increasing proportion frozen $p_s$ until after $p_s=1-p_u$, when the solid concentration remains constant at $c_u$, the eutectic composition. $p_u$ is the proportion of eutectic formed as the last-freezing portion of the crystal. For another dopant, e.g., p-type Al ($k_{al}=0.1$), the solute concentration profile is shown by the, less steeply rising, broken line $c_p$ in the same figure. Where $c_p=c_n$, a pn junction is formed at $p_s=p_j$. For the system Al-Sb in Ge, the Pfann's equation gives:

$$c_p = 0.1 \, c_o^{Al}(1-p_j)^{-0.9} = c_n$$
$$= 0.003 C_o^{Sb}(1-p_j)^{-0.997};$$

Hence, $pj = 1 - 2.0 \times 10^{-16} (c_o^{Sb}/c_o^{Al})^{10.3}$.

The value of $p_j$, i.e., the fraction solidified at the pn junction, must lie between 0 and 1.0. Hence, $c_o^{Sb}/c_o^{Al}$ must lie between 0 and 33.33. If then, $c_o^{Sb}$ in the melt is 1 ppm (e.g., 0.1 mg of Sb in 100 g of Ge), while $c_o^{Al}$ is 0.1 ppm, then $p_j=3.982\times 10^{-6}$. That is, if the crystal is 10.0 cm long, then the junction is located at 0.398 microns from the seed end. If, in the above case, $c_o^{Sb}$ in the original melt is only 3.21 ppm instead of 1 ppm, then $p_j=0.327$; and the pn junction in a 100-micron, melted thin layer is now at 32.7 microns from the substrate on which the crystal nucleates.

In an alloy system having a phase diagram of the eutectic type, the last portion of freeze must be a eutectic of substantially constant composition $c_u$ and melting temperature $T_u$, no matter how small $c_o$ is. That is, one always gets eutectics, in the end portion of the crystal, between dendrites, or in the boundary regions between cells or grains.

A eutectic generally has two different phases, i.e., a plurality of phase bodies in the form of microscopic globules, rods, or sheets of a first phase material embedded or dispersed in a matrix of the secondphase material. By "microscopic", I mean fractional micron to about 15 microns in thickness. This second-phase material may, for example, be a relatively pure (semiconductor)device material, while the first-phase material may be a dopant in the original melt, or vice versa. Further, when these phase bodies occur as elongated rods or sheets, they are generally oriented parallel to the direction of eutectic growth, In addition, under proper growth conditions, these rods or sheets may be dispersed in substantially perfect, microscopically uniform and geometrically regular patterns, e.g., in triangular or hexagonal arrangements or having equal thicknesses and spacings, respectively for the eutectic rods and sheets.

The eutectics produced in alloy systems containing more than two constituents are complicated by the relatively unknown but unique paths of freezing according to the liquidus and solidus surfaces. Yet this complication is not apparent in the microstructure, which is indistinguishable from that of the binary systems.

In a properly designed eutectic of this invention, the phase bodies are electronically substantially more conductive (i.e., by over one or two orders of magnitude) to the electronic signal current than the matrix phase (or vice versa in some devices). Yet, the phase bodies are physically separated and spread out in the matrix material. The matrix material is very little, if at all, heated by ohmic heating (current squared times resistance) but actually isolates and dissipates the heat of a hot phase body embedded therein. Further, the microscopically thin cross-section of the phase body always posseses very large surface-to-volume ratio for very effective heat removal. On the other hand, in the conventional device, heat in any hot spot is not easily dissipated, not only because the hot spot tends to have a spherical shape with minimum surface-to-volume ratio, but also because it is surrounded by neighboring, simultaneously and also ohmically heated material of similar temperature-resistivity characteristics. In addition, any heat in the hot spot instantaneously heats up the neighboring, similar material, a condition particularly critical in pulse-operated devices. Hence, service conditions often exist which will trigger thermal run-away in conventional devices, but not in microstreamed devices.

The flow of (minority and/or majority) current carriers in these microstreamed devices is thus highly regulated, so that either the flux density of the carriers varies periodically in a predetermined manner, with a microscopic period of fractional microns to about 20 microns along a direction transversely of the flow direction; or the carriers are confined to flow mainly (i.e., over 80%) in the phase bodies (or matrix material) as microscopically thin (i.e., micron-sized) shunting streams. This new structure, having a new mode of operation, yields radically improved results.

Such improved results include device uniformity, reliability, and reproducibility. Specifically, these microstreamed devices ensure uniform carrier current flows therein, and reduce or avoid hot spots and under- or over-currents in localized areas. This is in contrast to the oridinary solid-state devices during the operation of which hot spots often form, as previously described, to locally increase the temperature, conductivity, and current, thereby causing further increases in these parameters and resulting in device failures.

Eutectic manufacturing procedures have been given by Kraft (U.S. Pat. No. 3,124,452), Weiss (U.S. Pat. No. 3,226,225 and U.S. Pat. No. 3,267,405), Lemkey (U.S. Pat. No. 3,434,827), Heimke (U.S. Pat. No. 3,434,892), and Müller (U.S. Pat. No. 3,442,823). In particular, Kraft and Weiss have taught the exact conditions for producing eutectics of the required forms or morphologies, for uses as structural materials and as passive, junctionless though ambient-sensitive resistors, respectively. Normal freezing and zone melting are particularly recommended for single crystal and eutectic growth (Weiss). Pfann (Zone Melting, Wiley, New York, 1958.) has developed equipment for handling melts weighing from milligrams or less to several tons. For critical growth parameters such as growth rate and temperature gradient in the melt, see Pfann, Tiller (in Cahn: *Physical Metallurgy*, North-Holland, Amsterdam, 1965), and many others. Kraft's method (U.S. Pat. No. 3,124,452), for example, comprises unidirectionally moving a planar solid-liquid interface in a direction normal to this interface by, e.g., the zone-melting technique of Pfann. The ratio of the liquid temperature gradient G to growth rate V is to be controlled within the range of 0.1 to 1000, and preferably between 1 and 300 °C-hr/cm$^2$ (Column 10, lines 49-51).

Oriented and anisotropic, melt-grown inclusions have also been obtained by Weiss (U.S. Pat. No. 3,226,225) with the following eutectic melts: InSb-Sb, GaSb-Sb, InSb-NiSb, InSb-MnSb, InSb-CrSb$_2$, InSb-FeSb$_2$, Ge-Ni, Ge-Mn, Ge-Fe, and Ge-Co (Column 3, lines 66-70). One may use these oriented eutectics as the starting materials, to be subjected to the various manipulative operations to be described, so as to make the many novel active devices of this invention. One can also start with melts of the euutectic systems of Ge with Ag, Al, Au, Bi, Ga, In, Pb, Sb, Sn, Tl, and Zn; or of Si with Ag, Al, Au, Be, Ga, In, Sb, and Sn (Hansen: *Constitution of Binary Alloys*, McGraw-Hill, New York, 1958 ). The eutectics from these melts contain microscopic, metallic phase bodies which, being in intimate contact with the semiconductor Ge or Si bodies, are ideal for uses as highly regulated, multiple ohmic or metal-semiconductor barriers. From the melts of the eutectic systems of Ge with As, Cu, Mg, Te, and Zr; or of Si with As, Ca, Ce, Co, Cr, Cu, Fe, Mg, Mn, Mo, Nb, Ni, Pd, Pt, Ta, Ti, U, V, W, and Zr (Hansen), on the other hand, multiple barrier regions between semiconductor and intermetallic compounds are obtainable. By controlling the electrical characteristics and geometrical configurations of the barriers, and providing suitable biasing means, may eutectic devices of this invention are produced.

Using the same eutectic growth procedures of Weiss, Kraft, and many others, one can obtain, in an analogous manner, oriented and anisotropic, melt-grown inclusions from the above eutectic systems. As a specific example, a Ge-Al melt of exactly the eutectic composition and consisting of 53.8 g of Ge (resistivity 10 ohm-cm) and 46.2 g of (99.999% pure) Al is zone melted by induction heating (15 Kw at 0.5 megacycles). The melt container is made of highpurity (1 ppm impurity) graphite in the form of a horizontal boat. This boat has a rectangular hollow space therein measuring about 1.5 cm wide $\times$ 2.5 cm deep $\times$ 12 cm long. The bottom edges and corners of the boat are rounded. The finished crystal will then be about 1.5 cm $\times$ 1.5 cm $\times$ 12 cm. The induction coil preferably has two water cooling coils on both sides to positively control the temperature gradient in the liquid melt at about 100° C/cm. The coils are passed back and forth several times to homogenize the melt composition. The final pass, lasting about 6 hours, then starts at one end of the boat and proceeds at a very steady rate of about 2 cm/hr. These conditions give a ratio G/V of 50° C hr/cm$^2$. The nearly 100% eutectic crystal consists essentially of longitudinally aligned, lamellae phase bodies embedded in a eutectic matrix. If, however, the original melt contains 60.0 g (instead of 53.8 g) of Ge, then a "proeutectic" Ge crystal or layer (about 0.76 cm long or thick) first forms, to be followed by the Ge-Al eutectic growth. The proeutectic Ge crystal or layer is useful to form electrical contact or barrier region (See, e.g., the top white layer of FIG. 2).

The eutectic crystal grown by Weiss or according to the above technique is now longitudinally mounted with dissolvable wax or cement on a jig. The mounted crystal is sliced into wafers 10 to 20 mils thick with a diamond wheel and normal to the eutectic growth direction. The wafers are then parallel ground and lapped in a stepwise manner, with successively finer abrasives. A final mirror finish is obtained with fractional micron diamond polishing compound. The finely polished wafers are carefully examined under an optical microscope at 30 to 1000 times magnification to see the shape, size, and spacing of the phase bodies; and to detect any defects. To facilitate this examination, the wafer is surface-etched.

Figure 2:
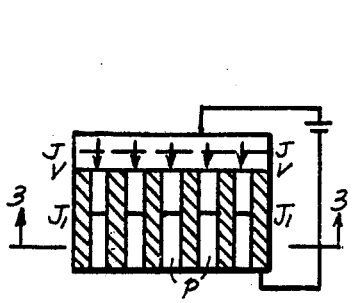
FIG. 2 is a eutectic microstreamed device in operation.

Next, the polished and inspected wafers 6-15 mils thick are remounted and sliced parallel and normal to the eutectic lamellae, to produce the devices of FIG. 2. In these devices, the top white layers (of metal or semiconductor) may be part of the proeutectic metal or Ge, or may be a vapor or chemically deposited layer, or may be a melt-grown layer. The pn junctions or barrier regions may be melt-grown inside the eutectic region (such as at $J_1-J_1$), or may be at the interfaces between the eutectic regions and the top layers (at V—V), or may be inside the top layers (at J—J). In melt-grown pn junctions, the method of differential segregation with, e.g., both Al and Sb dopants as described previously, may be used. The junction may also be driven into the eutectic mass by diffusion, outdiffusion, ion-implantation, or other techniques well-known in the semiconductor industry. Diffusion in nitrogen at 1100° C with a $P_2O_5$ source, for example, gives a surface phosphorus concentration of over $2 \times 10^{22}$ atoms/cc that can readily achieve the desired drive-in effect.

In FIG. 2, the junction plane J—J is shown to be substantially normal to the eutectic phase bodies and located within a few microns of the common terminal plane V—V of the eutectic phase bodies. Further, the (white) phase bodies are electronically substantially more conductive than the matrix material (cross-hatched). Suitable electrical contacts are made to the top and bottom surfaces of the device to forward or reverse bias the device. Vacuum-evaporated Al layers, e.g., form good ohmic contacts to both p-type Ge or Si, or n-type Ge or Si if the dopant concentration in these materials exceeds about $5 \times 10^{18}$ atoms/cc. Electroplated Cd, Cu, Au, Ag, and Zn from the cyanide solutions are rectifying on n-type Ge, but ohmic on p-type Ge. On the other hand, electroplated Sb from the fluoborate solution is ohmic on n-type Ge but rectifying on p-type Ge. The microstreams of current carriers are shown by arrows as entering the phase bodies from the top white layer.

Figure 3:
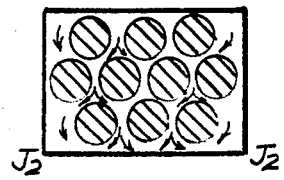
FIG. 3 is a transverse cross-section along the line 3—3 in FIG. 2.

FIG. 3 is a cross-section of the device of FIG. 2 along the line 3—3. Here, the eutectic phase bodies are globules or rods and, furthermore, electronically substantially less conductive than the matrix. Hence, the signal current flows down the paper mainly (i.e., over 80%) in the more conductive (white) matrix. This matrix is suitably spaced so that the phase rods or globules are spaced no more than three or four times the diameters of the phase bodies shown as cross-hatched rods or globules arranged in multiple layers. The signal current is, in this device, in the form of somewhat continuous though irregularly shunting and non-parallel, but still microscopically thin, streams. The pn junction here coincides with the lower edge $J_2$—$J_2$ of the device.

Figure 4:
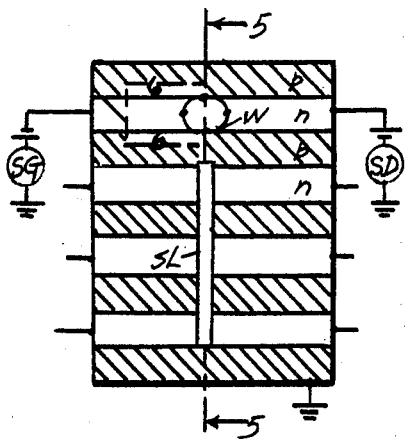
FIG. 4 shows a pair of integral, permanently-aligned, reversible or complementary, optoelectrical arrays useful as light-emitters, laser arrays, memory pads, or logical devices.

FIG. 4 shows a mass of a eutectic material provided therein with special openings. The shape, size, orientation, and surface properties of the opening may vary from one device to another. A number of conventional techniques may be used to provide the opening. These techniques include: drilling, sawing, machining, etching, laser cutting, and the like. In the lower part of the device of FIG. 4, the opening is in the form of a slot, SL, oriented normally to the eutectic phase bodies (n-type) to expose the many cylindrical or lamellar pn junctions associated with these bodies. The single slot SL thus divides the eutectic mass into two physically integral but electrically isolated, optoelectrical device arrays on both sides thereof. Further, each device component on one side of the slot is exactly and permanently aligned with a corresponding component on the other side, so that these components are optically coupled with great efficiency. To further increase the coupling efficiency, the surfaces of these components may be specially contoured (See the topmost component in FIG. 4), according to a curve given by U.S. Pat. No. 3,500,135. In addition, the light-collecting plane in the junction region of light collectors may be located optimally, together with the use of novel metallic surface reflective coatings and light shielding means on both the light emitters and collectors, as shown in the same patent.

Because the eutectic phase bodies may be only one or maybe two microns in size, separated possibly by also one or two microns of boundry layer. Hence, if properly designed, a 50 × 50 array of diodes may be smaller than 150 $\mu$m × 150 $\mu$m, or 0.15 mm × 0.15 mm in area, which is orders of magnitude smaller than those made by conventional methods. In fact, these devices may have reached the ultimate in bipolar miniaturization, having their sizes close to or comparable to the junction region widths required for effective signal translation.

The optically coupled diode arrays of FIG. 4 may also provide compact and inexpensive data storage and processing for computers, telephone switching, and other advanced systems. In this case, one array (left side, for example) is used as the memory or light-emitting section, each individual diode therein is selectively connected to a constant exciting (forward) voltage for light emission, so as to be turned from optically off to on, corresponding to a change in the memory level from "0" to "1". The other (right) array then acts as the sensing, reading-out, or light-collecting section that senses the light status of each diode or "address" on the light-emitting or memory section.

Alternately, any one diode having a cylindrical or annular pn junction (for example, in the central cell of FIG. 9) on the sensing section may be designed, by appropriate hole or slot geometry and suitable electrical sensing circuitry, to read the "1" level when any 1, 2, 3, 4, 5, or all 6 of the surrounding diodes (or cells in FIG. 9) on the light-emitting section are emitting light at their pn junctions. Devices with planar pn junctions may be similarly designed.

The slot SL may in some cases be extended only at its top and not at the bottom. This slot then separates the two sides into two physically integral (at the bottom) for electrically isolated parts, such as for integrated optics. For many LED or laser applications (left side of FIG. 4), the device materials should preferably be GaP, GaAs, or GaAs-GaAlAs formed by melt growth of this invention, with or without subsequent modification such as by diffusion, ion implantation, or epitaxial growth. The right side of the device of FIG. 4, instead of being a reverse-biased, light-detector array, may even be a reverse-biased, light-modulator array, advantage being taken of the Franz-Keldysh effect (See, e.g., Franz, W., 1958, Z. Naturf 13, 484), i.e., shift to lower photon of the optical absorption edge in a selected semiconductor layer under a electrical field. Even two similar slots may be formed on the device of FIG. 4 to obtain a light emitter/modulator/detector array.

Another use of the diode arrays of FIG. 4 is to extend the slot SL until it separates the two arrays, to reverse bias all the diodes on one array for light-collection, and to subject the array to an unknown, incoming beam of light. By feeding the radiation-transformed electrical signals, each representing the light collected or sensed by a particular diode at a specific location, into a programmed digital or analog computer, an instantaneous and detailed analysis and data print-out may be had on the unknown light characteristics; such as: average light intensity, light beam size and location, light intensity distribution, light frequency or color spectra.

The separated light-collecting array of FIG. 4 may be used in a different manner as follows. A single light beam from a laser or light-emitting diode is passed through two acoustoelectric crystals (e.g., CdS, GaAs) that are electronically controlled. These crystals deflect the beam in direct proportion to the frequency of sound waves made to pass through them. One crystal bends the light beam from left to right; the other, up or down. As a result, there are many different positions in space, corresponding to the positions on the light-collecting array, at which the beam can be aimed as it emerges from the second crystal. This solid-state system will record some characteristics of sound, e.g., the time variation of the frequency of some unknown sound, and transform the characteristics into time-serial, electrical pulses generated at the diodes of the array.

If one prepares the opposite faces of a eutectic disc on the separated, light-emitting array of FIG. 4 by carefully polishing to substantially optical flats exactly parallel to each other but normal to the (cylindrical or planar) junctions to form optically resonant cavities, applies electrical contacts to the eutectic phase bodies, and electrically grounds the eutectic matrix, a 50 × 50 laser array may be had, again also possibly within 0.15 × 0.15 mm². This laser array will controllably emit exactly oriented, perfectly parallel laser beams at prespecified positions thereon, either alternately or simultaneously, as needed. The intensity of each beam may be individually adjusted by proper control of the power or voltage applied on the diodes.

In this laser array, as in the arrays of FIG. 4, the dimension of the diodes and their spacings and geometries can be kept constant to within a small fraction of a micron. This is because eutectic microstructures are highly regular. Further, the laser beans as obtained, and even the two arrays on the two sides of the slot of FIG. 4, are perfectly and permanently aligned and positioned, a very costly affair if not an impossibility with conventional techniques.

Transistor and tetrode (or four-layer diode) arrays can be made from the diode arrays (of FIG. 4) by, e.g., additional diffusion, epitaxial growth, and/or ion implantation.

Each diode of the laser array, or of the separated light-emitter array of FIG. 4, generally emits a visible or invisible light of prespecified compositions or spectra, with an intensity increasing with the forward bias applied thereon. Gallium arsenide phosphide for example, efficiently emits a bright red spectrum of 0.650 micron wave-length with only 10 ma at 1.6 volts of input power. These arrays can therefore be used to display or transmit mono-color pictures.

If, however, CdS is suitably prepared as the electroluminescent device material, then at a low forward current level (around 7.5 a/cm²) blue (0.497 micron) is emitted, while at a higher current level (around 15 a/cm²), green is emitted (See Yee and Condas, Solid State Electronics 11, 419, 1968). This allows multi-color picture display. Gallium phosphide diodes can even be individually doped to achieve green, yellow, or orange outputs under nearly the same bias.

The wavelength of laser emission from lead tin telluride can be tailored over a wide range, i.e., from 4.2 to 10 microns. The absorption characteristics of a fluid, either stationary or flowing in the slot of FIG. 4, can be tested based on these results. To vary the emission wavelength, one simply varies the amount of tin in the telluride: the heavier the tin concentration, the shorter the wavelength. In the device of FIG. 4, the left side of the slot forms the variably tin-doped laser array, while the right side of the slot the detector array. One may also variably dope the laser diodes in the arrays of FIG. 4 from top to bottom, while simultaneously differently surface-contouring the same arrays from front to rear U.S. Pat. 3,430,109). This device allows the determination of the absorption characteristic of a stationary solid in, or a moving liquid through, the opening or slot SL, not only in regard to light beam wavelength but also in regard to beam intensity or spreading characteristics.

Figure 5:
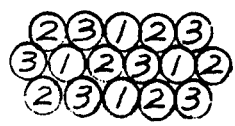
FIG. 5 shows an arrangement for the three (primary) color dots for color-picture display and transmission in connection with the light-emitting array obtainable from either side of the dividing line 5—5 in FIG. 4.
Figure 9:
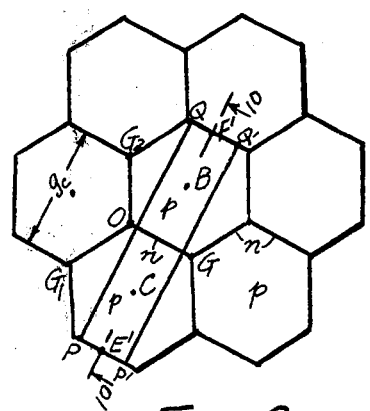
FIG. 9 is a longitudinal end view of some melt-growth cells, grom which a cellular device is made.

The heat from some light beams may also be used to selectively change the color of some radiation- or heat-sensitive particles (such as liquid crystals) optically communicable, or in optical alignment, with the light beams. This also allows multi-color picture display or transmission. In particular, two or three different types of radiation-sensitive particles may be chosen, or the particles can be so selected as to respond to two or three specified levels (i.e., levels 1, 2, and 3) of light beam intensities, so as to respectively yield two or three primary colors (preferably blue, red, and yellow). In addition, the particles or light intensities are applied to specific locations, as shown in FIG. 5, where the numbers 1, 2, and 3 refer to the three light beam intensity levels or primary colors. A flat, color TV picture display device is now obtained. Alternately, the radiation-sensitive particles may be replaced by suitable color filters, to achieve the same multi-color picture display results. In two-color display devices, each eutectic phase body or cell is surrounded by six similar bodies or cells in a hexagonal pattern, as shown in FIGS. 3 and 5 or FIG. 9, respectively To facilitate making electrical contacts, the n-type eutectic matrix or phase bodies can be selectively removed by electrolytic etching. In this operation, the n-type regions are connected in parallel to form the multiple anodes, while an inert carbon or platinum cathode together with a suitable (weak, generally non-chemically etching) electrolytic bath, such as an aqueous solution of 5 volume percent each of HF and $HNO_3$, is used. The reverse-biased pn junctions will prevent the etching currents from flowing into the p-regions. This results in removal only of the n-regions, from the ends of the phase bodies inward. The p-regions thus protrude out for easy electrical contacting. A simple, economical way is to simultaneously solder, spring, alloy, or soft-metal contact the tips of all the protruded p-regions onto a selectively metallized, insulating support having conductive paths printed thereon beforehand. The metal phase bodies such as Ag, Al, Ga, In, Sn, and Zn in the metal-Ge or metal-Si eutectic mass can also be selectively etched off by common acids such as $HNO_3$, HCl, and $H_2SO_4$. On the other hand, the Si or Ge phase bodies may be preferentially etched off relative to many nobel metals such as Au, Pt, Pd, . . . , by means of mixed $HF-HNO_3$ acids, as per conventional Ge and Si etching technology.

Figure 6:
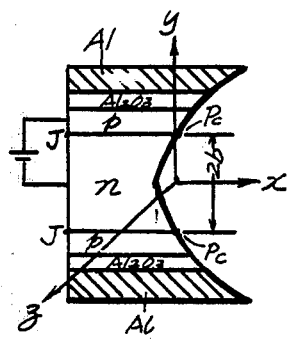
FIG. 6 shows a surface-contoured, light-emitter or collector comprising a single eutectic phase body selectively cut from the device of FIG. 4 along the broken line of the rectangle.

Each diode or a group of adjacent diodes in either optoelectrical array of FIG. 4 may even be selected and isolated, along the broken line of the rectangle by cutting, grinding, masking and etching, or other means. A new optoelectrical energy-transforming device is then obtained. This device comprises a single eutectic phase body or several such bodies of an electroluminescent or radiation-sensitive device material (such as GaAs, GaP, GaAlP, Ge, Si, . . . ). In this device (FIG. 6), the pn junction is in the form of an annular ring (in a phase rod) or two parallel stripes (in a phase sheet) melt-grown or otherwise produced inside the phase body. The Ge-Al eutectic slice or wafer has been preferentially oxidized at the interfacial surfaces between the Ge and Al phase bodies, so as to form insulating Al$_2$O$_3$ layers around the Ge phase body, or even to form unique metaloxide-semiconductor structures as shown in FIG. 6. The principle of prefential oxidation is described in U.S. Pat. No 3,765,956. In practice, one uses an oxidation temperature of 0.3 to 0.75 times the absolute melting point of Ge or Si (i.e., 97–652° C for Ge), in an open-end, two-inch quartz tube with wet oxygen flowing therethrough at 5 cubic feet per minute; or in a closed quartz vessel under a partial oxygen pressure of 10–400 microns. The preferential oxidation is stopped as soon as an electrical test indicates that the Al and Ge phase bodies are substantially electrically insulated from each other. It is to be noted that in Weiss' Weiss'oriented Ge-Co, Ge-Fe, Ge-Mn eutectics, the metals all have higher heats of oxidation than Ge and are, therefore, preferentially oxidizable thereover. Other reactive metals relative to Ge and Si include: Ce, Dy, Er, Gd, Ho, La, Nb, Pr, Sm, Ta, Tb, Ti, Tm, U, Y, Yb.

The device of FIG. 6 transforms energy from one type to another, one of the types being radiation at or near the peripheral surface of the pn junction region, and the other being electrical energy at the two end or terminal planes of the same junction region. For operation as light-collector, the incoming light quanta must have energies equal to or exceeding the band width of the semiconductor material, to allow the hole-electron pairs to be formed. In this connection, it is desirable to surface-contour or differentially expand, the pn junction region peripheral surface (FIG. 6). This procedure achieves not only greatly expanded junction surface, but also radiation focussing effects and, in addition, resistance to surface contamination by mobile ions, submicron dust particles, or contacting surfaces (See U.S. Pat. No. 3,430,109).

As shown in my U.S. Pat. No. 3,500,135, the optimal surface contour for focussing parallel incoming radiation in an x-y plane onto two prespecified, light-collecting points, P$_c$, at a non-negative distance 2b apart in the same plane should have an equation of the following form:

$$\sqrt{x^2 + y_1^2} - x = \text{constant},$$

where the y-axis joins the two points and the x-axis is normal to but bisects the straight line joining the two points, and where $y_1 = b + y$ for the portion of the curve above the x-axis, but $y_1 = b - y$ for the portion below the x-axis.

The peripheral surface of the device body including the junction region may also be surface-coated with a layer of a reflective metal such as silver and aluminum. This layer is electronically conductive outside, but nonconductive inside, the junction region, as taught in my U.S. Pat. No. 3,500,135. Further, the optoelectrical device according to U.S. Pat. No. 3,500,135, the optoelectrical device of, e.g., FIG. 6, may include light-shielding means centrally positioned to restrict the emitted or collected light rays to travel substantially radially to or from the contoured peripheral surface, thereby insuring parallelism of the emitted or reflected, outgoing rays, or achieving maximum focussing effects of the incoming rays. The light-collecting device should have light collecting z-y plane exactly positioned inside the junction region so that the electron and hole generated by an impacting radiation particle arrive at the respective collecting, terminal planes of the junction region at exactly the same time, thereby producing a fast, pure, and strong output signal.

To make the self-insulated devices or device arrays, one can also start with a Ge-Al or Si-Al eutectic crystal grown by, for example, the zone-melting method previously described. Slice the crystal into thin wafers (less than 10 mils thick), selectively oxidize the aluminum matrix into insulating Al$_2$O$_3$, without deep penetration and by means of the conventional masking and diffusion techniques. The masking technique consists of coating the wafer with a thin layer of Kodak KPR or other suitable photoresist, to be exposed under ultraviolet light with mask on and later developed. Silicon can be oxidized to SiO$_2$ at 1150° C at the rate of about 8000, 2200, and 1800Å/hour in steam, wet oxygen, and dry oxygen, respectively. Excessive SiO$_2$ can be etched off with 30 or 50% HF at the rate of 5000 and 18000 Å/min. (at 25° C). Ge can be similarly oxidized to GeO$_2$ at 500–800° C. Junctions in this thin wafer can be formed by the conventional masking-etching-diffusion techniques as per Ge and Si diffusion technology. Ion-implantation method can also be used for both oxidation and junction forming.

In the device of FIG. 4, the central opening or slot SL may be greatly reduced in length so as to become a cylindrical, elliptical, or other specially-contoured hole W. This hole may be machined (by drilling or laser beam) into the eutectic mass and centered on a single eutectic phase body, as shown in the topmost component of the device of FIG. 4. Here, the hole W divides the eutectic phase body or several adjacent such bodies each two electrically isolated bodies. One or more pairs of integral or permanently aligned, optically coupled diodes then result. These diodes, as a unit, may be electronically isolated from the rest of the device by, e.g., device boundry oxidation previously described. These complementary diodes may also be physically isolated by cutting, grinding, etching, and laser machining along the broken line of the rectangle.

In this topmost component, the hole W is elliptical with a vertical minor axis. The rounded top and bottom sides of the hole are tangential to, or within a few microns or even fractional micron of the junction region terminal planes, so as to greatly and differentially expand the junction region peripheral surface (U.S. Pat. No. 3,430,109). With suitable electrical contacts, a pair of reversible or complementary, optoelectrical diodes is obtained. In the figure, the left or light-emitting diode is forward biased to emit light in response to the signal generator SG, while the right or light-collecting diode is reverse-biased so as to detect the signal, i.e., the emitted light signal from the left diode, to be shown on the signal-display system SD. The thickness of the entire phase body may be only a fraction of a micron to a few microns. The pn junction may be in the form of an annular ring or of two parallel planes at fractional micron distance apart. The exact size and position of the junction may be modified by conventional techniques such as diffusion or ion-implantation. In this particular unit, a contacting device comprising three or four insulated spring metal clips may be inserted into the hole to make all the necessary to electrical contacts (at the black dots shown), simply and at very low costs. The hole may even be filled with radiation-transparent glass, epoxy, or other substantially electronically inert material to hold the contacting device in position, to prevent the junctions from some types of surface contamination, or to focus or otherwise modulate the incoming or outgoin light beams.

The germanium-aluminum eutectic is formed at the eutectic temperature of 424° C and contains 53.8% by weight, or 37.1% by volume of germanium (Hansen: *Constitution of Binary Alloys*, McGraw Hill, N.Y., 1958). The eutectic comprises substantially pure germanium phase bodies. By "substantially pure" is meant, in this application, that the germanium bodies contain up to the saturation limit of the impurity at the respective eutectic temperature, e.g., $3.6 \times 10^{20}$ atoms/cc for the impurity Al). These phase bodies of germanium are either separated or dispersed in a second type of phase bodies consisting essentially of aluminum saturated with germanium at 424° C, i.e., about 7.2% by weight of germanium. Knowing the volume or weight percent of germanium in the eutectic phase, and knowing some other data such as densities and solubilities, one can compute the thickness and spacing of eutectic phase rods or sheets for any eutectic materials.

Similarly, according to Hansen's phase diagrams, germanium also forms eutectics with Ag, As, Au, Cd, Co, Cu, Fe, Mg, Mn, Ni, Sb, Te, Zn, and Zr having 31.5, 58.6, 33.0, 3.0, 84.8, 51.7, 85.4, 60.2, 66.3, 77.0, 13.4, 10.3, 7.8, and 98.3% by volume of the germanium phase bodies. Silicon also forms eutectics with Ag, Al, As, Au, Be, Ca, Ce, Cp, Cr, Cu, Fe, Mg, Mn, Mo, Nb, Ni, Pd, Pt, Ta, Ti, U, V, W, and Zr having, respectively, 17.0, 12.9, 56.6, 33.8, 53.8, 50.0, 71.7, 85.8, 89.8, 41.4, 81.8, 52.4, 75.5, 96.7, 96.2, 69.3, 64.6, 72.5, 99.1, 86.8, 84.8, 97.9, 99.2, and 88.8% by volume of the silicon phase bodies.

One may also use reactive metals in the IV A group of the periodic table to form eutectics with silicon or germanium. Such metals include Zr, Ti, and Hf, which are non-doping relative to silicon or germanium. Zr, for example, forms a eutectic with germanium at 933° C and, having a heat of oxidation at 298° K of 260 Kcal/mol, is readily oxidized in preference to germanium.

It is to be particularly noted that in a two-phase melt-grown material, each phase consists essentially of a substantially pure first device material in the core portions thereof, but has progressively higher concentrations until saturated with the device material of the other phase (at the eutectic or compound formation temperature) in the portions contacting the other phase. This achieves graded concentrations at the contact zones and minimizes the physical and thermal mismatch stresses and strains between the two phases. Further, the phase bodies are stable at even up to the eutectic or compound formation temperature when they are in thermodynamic equilibrium; but also stable at low temperatures when solid diffusivities are negligible. This graded structure and chemical stability are thus completely different from those of materials made by diffusion or vacuum and chemical deposition of one device material on another, not only mechanically or chemically, but from the viewpoint of device quality, uniformity, and stability. Such graded structures, and the associated unique concentration profiles, however, can be simulated by ion-implantation techniques.

The above disclosure describes several melt-grown eutectic devices—their structures, modes of operation, and methods of manufacture. But other melt-grown devices are also available. These include cellular devices, granular devices, and dendritic devices. Examples of these are given as follows.

Figure 7:
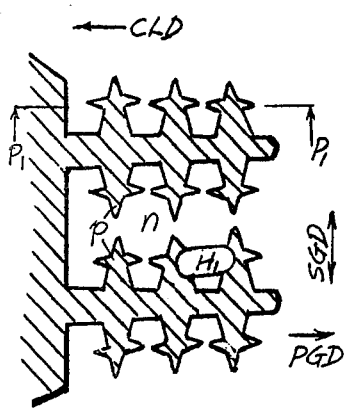
FIG. 7 shows an example of dendritic growth and some dendritic devices made therefrom.

It is well known (See Chalmers: *Physical Metallurgy*, Wiley, 1959, pp 231-306) that at slow growth rates, with steep temperature gradients in the liquid, and low impurity concentrations in the melt, the solid-liquid interfaces tend to be planar under unidirectional cooling. This planarity, however, is unstable if these growth conditions change. Specifically, at the other extreme, i.e., high growth rates, small temperature gradients in the liquid, and high impurity concentration in the melt, the interfaces are very unstable, and dendrites form. This gives rise to dendritic, polycrystalline growth (FIG. 7).

Tiller has shown (Cahn: *Physical Metallurgy* North-Holland, Amsterdam, 1965, pp 406–408), both theoretically and experimentally, that "the existence of a zone of constitutional supercooling ahead of a smooth planar interface is given by the following condition:

$$G/V - m\, c(O)\, (1-k)/k\, D_1 \text{ or } V - kGD_1/m(1-k) \\ c(O),$$

where G is the temperature gradient in the liquid at the interface, m the liquidus slope, and c(O) the concentration in the solid at the interface." For gallium in germanium, the following values are valid: $k = 0.10$, $m = -4.4°$ C/at. % (Hansen: ibid, p743). Also, $D_1 = 10^{-5}$ cm$^2$/sec and $G = 100°$ C/cm usually. Hence, for $c(O) = 10^{-2}, 10^{-1}$, and $10^{-0}$ at. %, if the growth velocity V exceeds 0.353, 0.0353, 0.00353cm/sec respectively, constitutional supercooling and cellular growth will result.

Tiller further shows (Cahn: ibid, pp412–413) that "as the solute concentration in the liquid, $c_o$, is increased, a point is reached when the caps of the cells project far enough into the liquid that they are unstable with respect to perturbations in a lateral direction around the cell. This condition produces the onset of side-branching and is described as the dendrite breakdown condition" Experimental data for both the cellular and dendritic breakdown are given.

Figure 8:
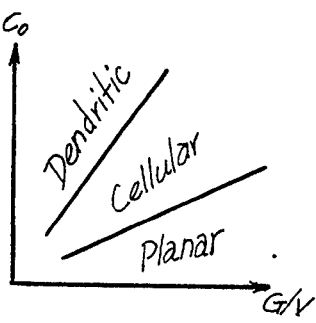
FIG. 8 shows the general relationship between growth conditions and the various types of crystal growth.

The materials, equipment, and personnel for melt growth invariably vary from one place to another. However, armed with the above teachings, the skilled person can immediately estimate the optimum growth conditions from the phase diagrams and measured or estimated $D_1$ and G. If the first growth test does not give the exact morphology desired, the teachings of this specification, and U.S. Pat. No. 3,765,956, and, in particular, FIG. 8, show which directions to go for correct results.

Dendrites (FIG. 7) are single or branched projections that extend into the melt. The single projections or dendritic stems generally form along the primary growth direction (PGD), opposite to the cooling direction (CLD); while the branches grow from the stems. Sometimes, small secondary, tertiary, . . . branchlets may grow simultaneously. The stems and branchlets may be microscopic in sizes. Further, as always, the last portion to freeze between the stems or branches must also be a eutectic for a eutectic alloy system.

Dendrites can be utilized much like the eutectics. For example, one can grow dendritic stems or branches of high electronic conductivity in a suitable matrix of substantially lower conductivity. The carriers then flow systematically, from the stems to the branches, to the branchlets, . . . , giving rise to a microbranching effect. Also, the dendritic block of FIG. 7 may be selected under a microscope, cut along the plane $P_1$—$P_1$, selectively oxidized in the matrix for complete insulation, and deposited with n-type layers thereon to make diodes or transistors. Optoelectrical complementary diodes of the type described above can also be made between the two stems or branches, as shown by contoured hole $H_1$ in FIG. 7.

A Ga-Ge cellular growth procedure is given as follows: 69.7 mg of (99.999 at. % pure) Ga and 36.3 g of (zone-refined, 10 ohm-cm) Ge are melted together (at 0.2 at. % of Ga) in a high-purity (1ppm impurity) graphite crucible 1 cm I.D. × 10 cm long. The melt is unidirectionally cooled, after thorough stirring (by induction currents, for example) and melt homogenization, in the longitudinal direction to freeze the melt at 0.002 cm/sec under a liquid temperature gradient of 100° C/cm. This requires about 1.17 hours to finish the cellular crystal measuring about 8.45 cm in length. An inert argon or helium gas ambient above the melt is desirable during the growth to prevent melt oxidation. For dendritic growth, everything is the same except that 60.9 mg of Sb is used instead of the 69.7 mg of Ga (so as to give 0.1 at. % of Sb in Ge). Growths of other systems in cellular or dendritic forms can be determined by theory, or a few tests guided by FIG. 8. For Al-Ge cellular growth, e.g., one simply has to change to 69.7 mg of Ga by 187 mg of Al (1.38 at. %) in the above procedure. Similarly grown Sb-Ge cells will be used as examples in the manufacture of cellular devices.

If multiple nuclei are present and scattered throughout the entire melt mass, then three-dimensional, multiple grain growth usually results. Tiny grains, perferably of close-packed, twelve-faced single crystals, are small in all three dimensions. Solid-state devices made of these grains therefore represent the smallest possible in size and weight, but fastest in speed. However, because of their small sizes, grains are inconvenient to handle and often difficult or impractical to electrically contact to. On the other hand, devices made of cells are relatively easy to handle and contact, because they generally have sizable lengths in the longitudinal direction. For ease of illustration, therefore, the following description relates mostly to semiconductor cellular devices made from germanium-antimony melts. With slight modifications, other solid-state devices of the cellular or granular types can also be made.

As a specific example, let us choose a melt of relatively intrinsic or pure germanium containing a p-type impurity (e.g., Al) that comparatively does not easily segregate on melt freezing. The same melt also has antimony as the dopant and segregating impurity. The amount of antimony is such as to form, upon cellular growth, exactly one monolayer (or $\frac{1}{2}$, 2, or 5 monolayers) of the Ge-Sb eutectic at the cell boundaries, i.e., OG, $OG_1$, and $OG_2$ in FIG. 9, where the symbol $g_c$ refers to the cell size.

Cooksey et al has shown, in Phil. Mag. 10, 1964, p755, that the cells are generally less than 100 μm across, even in impurity cells. Most semiconductor materials are relatively pure, the cells formed therein are unidirectional cooling therefore must be even smaller. Further, "within a cell the fine two-phase arrangement (spacing of the order of 1-2 μm) of the eutectic appears to grow normal to the solid/liquid interface at all points, as illustrated in their FIG. 8b, and elsewhere by Chadwick (1963).", and also by Kraft (ibid).

Since in cellular growth the solid/liquid profiles, or secondary growth fronts, tend to be roughly paraboloidal (Kramer, ibid), the sheet-like or rod-like phase bodies in the eutectic thus tend to start growing parallel to the (primary) growth direction coincident with the external cooling direction, i.e., along the cell axes (if the original melt is 100% eutectic); but bend, or tend to bend, nearly 90° thereto to intersect nearly normally to the cell boundaries, as is shown by the curved lamellae orientation line AC in Cooksey's FIG. 9. This normality relation is also clearly seen in FIG. 10 of Cooksey's. Similar reasoning applies to granular growth. The intercellular or intergranular, fine or microscopic, sheet-like or rod-like phase bodies oriented normally to the boundaries thus also provide the necessary structures to achieve microstreaming effects as described above.

For a given $c_o$ i a specific alloy system, the eutectic thickness, or a number n of the eutectic monolayers between cells or grains formed on normal freezing, is roughly proportional to the cell or grain size ($s_c$ or $s_g$), thus:

$$p_u \doteq 1.12\, c_o^{1.03} = 1.12 \times 10^{-7}\, n/s_g = 1.34 \times 10^{-7}\, n/s_c \text{ for Sb in Ge,}$$

where $s_c$ and $s_g$ are in centimeters.

Tables have been prepared (Li: Phys. Stat. Solidi 15, 1966, pp51–52) showing the initial impurity concentration $c_o$ necessary to achieve a given thickness or number n of eutectic monolayers between cells or grains of specific sizes.

For example, for $c_o = 10^{-3} = 0.1\%$ by weight of Sb in Ge, and $s_c = s_g = 10^{-3}$ cm = 10 microns, n = 12.34 and 8.224 for cellular and granular growth, respectively. That is, if the seven cells of FIG. 9 are grown from a germanium melt containing 0.1% antimony, and if these cells are 10 microns in sizes, then the cell boundaries $OG$, $OG_1$, $OG_2$ each has 12.34 monolayers, or about 40 Å of the Ge-Sb eutectic.

It is to be noted that during cellular growth, the impurities segregate not only transversely into the cell boundaries, eventually always as eutectic; but also segregate longidutinally ahead of the liquid-solid interface. This means that the effective $c_o$ of the melt, and hence $p_u$ in any transverse plane, continuously increases along the primary growth direction of cellular growth. That is, for a given cell size $s_c$, the eutectic layers at the newly-formed cell boundaries continually thicken as freezing proceeds (See FIGS. 10-11). The rate of thicknning can, however, be controlled, e.g., minimized, increased, or otherwise changed.

Figure 11:
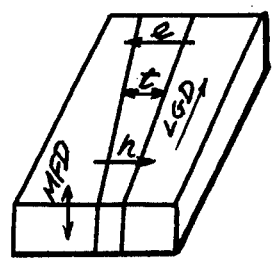
FIG. 11 is a longitudinal section of the device of FIG. 10, taken along the plane of the paper and showing a tapering barrier region sensitive to magnetic fields.

A novel device, shown in FIG. 11, can now be made as follows. This device contains two elongated bodies. Each body has a face tapering inwardly in a common longitudinal direction (LGD). The two tapering faces are made to face each other so that the distance t between them is monotonic increasing along the common longitudinal direction. A tapering layer forming the device barrier region is located between these two faces so as to fittingly match and join together the two tapering faces on the two bodies.

In the above device, a magnetic field may also be applied in a direction (MFD) generally parallel to the faces but normal to the common longitudinal direction, to cause the signal current carriers to interact with the field during their movements across the tapering barrier region. This produces the Hall effect, and causes the minority and majority carriers, i.e., holes h and electrons e, to flow through the same region at only selected, respective protions thereof. This controllably varies the distance of carrier travel through the barrier region and, therefore, changes the device signal-translating characteristics in accordance with the applied magnetic field. It is well-known that the base layer of a transistor, which may be the tapering barrier region in this device, critically determines the transistor performances. One now has a new, magnetically coupled active device, which is particularly sensitive to the magnetic field if the signal current carriers are predominantly only of one type, say for example, electrons.

Figure 10:
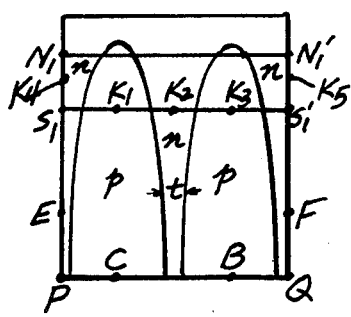
FIG. 10 is a section along the line 10—10 of FIG. 9.

Having obtained cells of the desired shapes, sizes, compositions, and boundaries, one can build many useful solid-state devices. For example, the device PP'QQ made from the two cells centered at B and C in FIG. 9 may be isolated by cutting, grinding, polishing, or etching; and electrically contacted at points E' and F'. This cellular device then has the cell boundary DG containing the Ge-Sb eutectic as the device material of the barrier region. Since the melt contains the relatively non-segregating p-type (Al) impurity, the bulk of the two cells will be p-type. The cell boundary OG, however, will be n-type, because of the segregating antimony, thereby forming two functions in the two interfacial regions between the cells and the boundary eutectic layer. This device thus represents a two-terminal pnp device (FIG. 10). In addition, this device will have some unique properties associated with the Ge-Sb eutectic barrier region material. As indicated above, the thickness of the eutectic boundary layer can be prespecified and controlled.

Useful devices can even be made of the same two cells without the relatively non-segregating p-type impurity. In this case, the resultant device will have the structure: n-type Ge/Ge-Sb eutectic/ n-type Ge. The antimony in the eutectic may also be replaced by oxygen or the respective oxide so as to obtain silicon or germanium semiconductor/oxide junctions.

Alternately, by leaving the Ge-Sb eutectic around the cells B and C, one can even obtain, after proper isolating and contacting, a npnpn cellular device, shown as $N_1-N_1'-s_1'-S_1$ in FIG. 10, where the symbols E and F denote potential contact points to the n-type material and the symbols P and Q denote the edges of the material.

The cells generally have paraboloidal shapes, which may be desirable. If not, the cell tips or bases can be removed (as at $S_1-S_1'$ or $N_1-N_1'$ in FIG. 10) by cutting or other methods. After the removal operations, additional electrical contacts, if needed, may be made at the tips of the cells (at $K_1$ and $K_2$). Contacts to grain boundary layers may also be made, for example, at $K_3$, $K_4$, and $K_5$ of FIG. 10.

Figure 12:
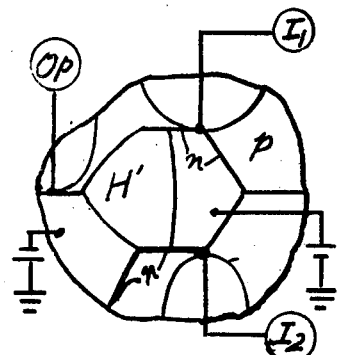
FIG. 12 is a transverse, sectional view of an optoelectric, logic device made from melt-grown cells.

FIG. 12 shows an optoelectrical logic device made from a mass of cellular material. As shown, a specially-shaped, carefully centered hole, H', is machined into the mass, and electrical contacts are properly made. The surface-contouring technique (U.S. Pat. No. 3,430,109) is used here to both expose the normally hidden boundary layers and to greatly increase the exposed area for easy contacting. In this device, the two right diodes are employed as light-emitting diodes or inputs $I_1$ and $I_2$; while the left diode as the output (Op) or light collector. The hole H' and the associated electrical circuitry can be designed so that the output diode normally is "0", but gives a signal of "1" when either one or both input diodes are optically on. One thus has an "either/or" or an "and" logic device. This device is similar in operation to the one with six input diodes as described previously in connection with FIG. 9 these six input diodes being represented by the six hexagons surrounding the central hexagon which carries the notation B.

In a similar manner, one can produce a rod-like eutectic mass having cylindrical pn junctions therein, and cut a thin slot (as in the device of FIG. 4) in it to form two face-to-face, optically coupled arrays, to be biased respectively as the light-emitting and collecting sections. Each diode on the collecting array is here not only faced directly with a corresponding diode on the emitting array, but also has three neighboring diodes on the opposite array. This makes another type of multi-choice logic device possible.

The shapes and sizes of the cells are controllable by predepositing through a mask a material containing the required impurity at positions A, B, C, . . . (FIG. 9). A wide variety of impurities is possible (Li: Phys. Stat. Solidi 15 1966, p445). These impurities include In, Ga, and Sb in Ge; and Au and SiO in Si. A single-crystalline substrate is desirable for controlled crystalline orientation. A feature of the invention is to test grow cells under identical conditions to determine the stable nuclei spacings for the chosen alloy system and growth conditions. The nuclei are then deposited at the same spacings apart to achieve great stability in the cellular growth.

The deposition step accomplishes the following: (1) facilitating the formation of nuclei, at only the deposited spots; (2) stabilizing the cellular growth conditions if the above test-determined nuclei spacings are used; (3) defining the cell geometries (i.e., hexagonal, square, rectangular, . . . ) and location or shape of the barrier regions; and (4) achieving controlled resistivity and concentration profiles across the cells and at the cell boundaries.

Each cell has a number of boundaries, six for the hexagonal cell, for example. Some or all of these boundaries may serve as the barrier regions or contacting areas. A simple device or complicated circuitry can therefore be built with only a very few cells. This feature helps greatly in device miniaturization.

Various modifications in the design and manufacturing methods of the above basic cellular devices are readily available. These include: surface oxidation, regrowth, diffusion, ion implantation, and grain boundary diffusion. Selected wires, ribbons, sheets, spheres, ellipsoids, . . . , with or without surface insulation, may be strategically positioned in the melt during cellular growth to affect local heat transfer. They may even be purposely left in the cells to serve as conducting leads, capacitors, inductances, or other circuit elements.

After controlled growth of the cells, one can lift these cells out of the melt and shake off the excess liquid to give a "decanted" cellular structure. While still hot or partially molten, the cells may be surface-oxidized to provide insulating or passivating layers. Further, the cells may be reinserted into another melt having a different composition, or thermal, electrical, or other environments from the one from which the cells were initially grown. This procedure gives additional flexibility in processing by allowing new barrier regions having selected device materials therein to be formed, or existing layers of these device materials to be modified.

An almost infinite variety of semiconductor or other solid-state devices thus are possible from melt-grown grains or cells, eutectics or dendrites. One has a wide choice of design parameters on these devices: grain or cell geometry; size, and material; number of grains or cells, or barrier regions per device; boundary layer composition, thickness, or other properties; and contacting and passivating methods. In fact, a melt-grown device may be tailor-made to suit each and every demand or requirement.

Once the new device structures disclosed herein are given, the skilled person can readily make them, even from a single crystal of Clarke or Tomono, or a bi-crystal or tri-crystal obtained readily on a Czochralski equipment. The following conventional techniques are useful in such manufactures: selection under the optical microscrope at 30 to 1000 times magnification; isolation by cutting, grinding, etching, or laser heating; diffusion; surface or boundary oxidation; epitaxial growth; and ion or proton implantation. Even the unique concentration profiles of melt-grown devices can be computed or measured and then simulated, to thereby achieve simulated melt-grown eutectics, dendrites, cells, grains and, hence, the unique graded structures and stabilities. It is also possible to make many of these devices in thin-film forms e.g., less than 100 microns thick, by means of vacuum, chemical deposition, or liquid epitaxy (or melt-flow) techniques.

Figure 13:
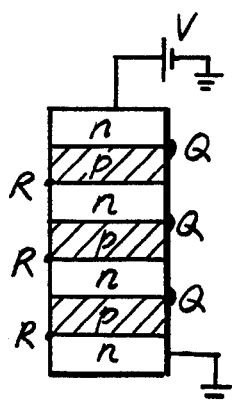
FIGS. 13–18 show other new melt-grown devices.

The LED, laser, or diode array of FIG. 13 is made by forming (e.g., through eutectic growth) the microscopically small, p-type semiconductor phase bodies dispersed in an n-type semiconductor matrix. An applied negative voltage V causes the stacked pn junctions to be alternately reverse and forward-biased. The reverse-biased junctions then form an array of light or radiation detectors, while the forward-biased junctions act as series resistors. If the applied voltage V is positive (instead of negative) relative to the ground, and if shunting resistors Q are provided to short out the reverse-biased pn junctions, then the every other, forward-biased pn junctions will emit radiation to form a LED or laser array. In either case, a low to very high voltage V can be applied directly to such a device for operation as a radiation emitter or detector array.

Figure 14:
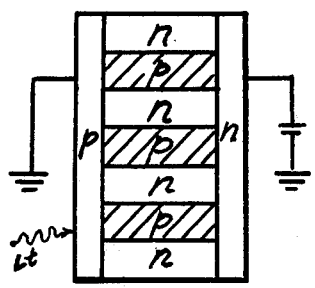

The device of FIG. 14 is made from a composite material of horizontal p-type sheets in an n-type matrix. Two vertical semiconductor layers, respectively p and n-type, form the left and right terminal regions of the layered device. One or more of these layers is formed by eutectic growth, epitaxial growth, thin film deposition, or other techniques. One of the layers, e.g., the left p-type layer, is made so transparent to radiation as to cause the sufficiently energetic radiation particles impinged thereon to generate hole-electron pairs to be collected at the multiple, reverse-biased pn junctions in the stack. Such a device can be used as a solar battery pack to yield any reasonable voltage or power output, if the numbers of parallel or series junctions are properly selected.

Figure 15:
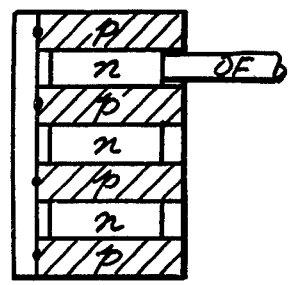

In FIG. 15, the white n-type, microscopically thin phase bodies are etched off preferentially relative to the surrounding, electrically grounded matrix (hatched p-type semiconductor) by chemical or electrochemical means (such as has been previously described). The protruded p-type bodies are then individually connected to a source of forward or reverse-biasing voltage so as to be separately controlled for emitting or detecting radiation. A forward-biased LED or laser array of such a design may be used on a printing mechanism by being connected onto a carriage driven through a simple cable and pulley arrangement by a step motor at the rate of e.g., 30 characters per second. The array prints out a character or column of characters desired and returns at the end of each printing line or page. The printing medium may be radiation or thermal sensitive paper, tape, cloth.

The protruded tips of the microscopic (p or n-type bodies) of the same LED or laser array (of size 1 × 1000 or 1000 × 1000, e.g.) may serve not only for the individual electrical contacts but also for holding the ends of matching, micron-sized optical fibers in a bundle. The tip of each such fiber fits snugly into the recessed n-type region for optical signal transmission, being held by the surrounding p-type regions (See OF in FIG. 15). A combined optical emitting and transmission system then results. The optical detector array may be a device similar in structure to the LED or laser array, and is electrically and optically connected by suitable contacts and the same bundle (but at the other tips) of the optical fibers. A complete, large-scale integrated optical system then results.

The material of the LED, laser, or detector array can be Si, GaAs, InSb, $PnS_{1-x}Se_x$, PbSTe, GaInAs, GaAlAs, GaAsP, PbSnTe, HgCdTe, GaAs also forms useful Schottley barrier diode arrays with metallic phase bodies or matrices. GaAs also is a useful acousto-electrical material in which the interaction between traveling elastic wave and drifting carriers can lead to amplification. Other such acoustoelectrical materials include CdS, $LiNbO_3$, GaP, Te, $HIO_3$, and $PbMnO_4$. High-purity CdS (one ohm-cm) cut normal to the [001] axis is also useful as a photomechanical material in which illumination is converted into mechanical strain. With these materials, integrated optoelectroacoustomechanical systems may be made.

Figure 16:
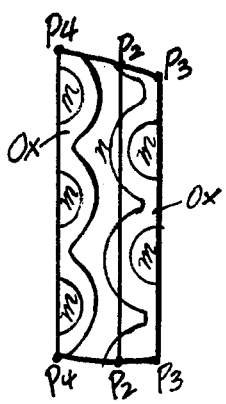

The device of FIG. 16 is made by: 1. growing a composite material containing microscopic, generally circular cross-sectioned metal globules or rods in a matrix; 2. preferentially oxidizing around the globules or rods to form oxide layers from 1500Å up in thickness; 3. selecting a portion of the composite material; 4. slicing off the selected portion at planes $P_4$—$P_4$ and $P_2$—$P_2$; and 5. electrically contacting each of the globule or rod. When the globules are sufficiently close to each other so that a continuous oxide layer of about 3000 Å is formed, the result is a charge-transfer device.

In the device of FIG. 16, the right slicing-off plane may be located at $P_3$—$P_3$ instead of at $P_2$—$P_2$. A new type of MOS-FET (metal-oxide-semiconductor, field effect transistor) device then results. As a charge transfer device, the voltage individually applied to the globules or rods on the right-hand side of the device (near plane $P_3$—$P_3$) facilitates the charge transfer process on the left-hand side of the device (near plane $P_4$—$P_4$). Notice that the globules or rods zigzag from left to right and vice versa.

Figure 17:
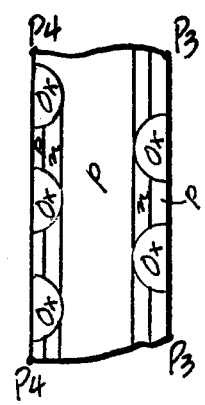

The oxide layer in the device of FIG. 16 may be discontinuous. If the rods are dielectrically insulating, or may be converted (at least on the surfaces thereof) into insulating materials such as $SiO_2$, the device of FIG. 17 then results. Here, discrete silicon channels are electrically isolated from each other by the insulating $SiO_2$ rods (or half-rods) on their sides. The end surfaces (parallel to the plane of paper) of the device may be oxidized. Additional oxide grooves may be introduced to normally intersect the grooves of FIG. 17 so as to form electrically isolated silicon pockets. Each such pocket may be an active or passive component of a large-scale integrated circuit. The required pn junctions for these components may be produced by repeated diffusions or ion implantations. One of these pn junctions may be only a few microns above the common bottom plane of all the insulating rods or oxide grooves. Electrical contacts to the various junctions or layers may be made as per conventional semiconductor technology. The core regions of the eutectic metal (Al, Zr, . . .) rods may be preetched before the oxidation so as to provide three-dimensional diffusion sources. The required oxide or insulating material, in particular, may be properly formed, shaped, sized, positioned and oriented relative to the pn junctions as to acquire the many novel results as described in my pending application, Ser. No. 386,102, filed Aug. 6, 1973.

Figure 18:
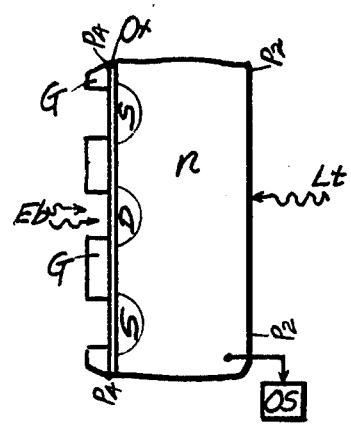

The manufacture of the integrated MOS (IMOS) device of FIG. 18 comprises: 1. growing a composite material containing microscopic, electrically conductive globules or rods dispersed in an n-type matrix; 2. slicing the material along plane $P_4$—$P_4$ to intersect in a close-packed plane or line these globules or rods, to be used as the source and drain electrodes; 3. slicing the material along a generally parallel plane $P_2$—$P_2$; 4. oxidizing the surface of the plane $P_4$—$P_4$ to a thickness of about 2500 A, e.g., in steam at 1100° C; 5. forming the gate elements G on the oxide layer partly overlapping the source and drain elements underneath the oxide layer. The right slicing plane may be at $P_3$—$P_3$ instead of at $P_2$—$P_2$ (See FIG. 16) and the globules or rods on this plane are similarly formed into MOS components. A zigzag, IMOS device is the result.

The first version (right slicing plane at $P_2$—$P_2$) of the device of FIG. 18 may comprise p-type semiconductor globules or rods (instead of metallic ones) dispersed in an n-type matrix. The metallic gate electrodes G are now replaced by radiation shields. The diodes are reverse biased such that they are nonconductive and act as capacitors to store charge. The diodes are biased in sequence as an electron beam EB repetitively scans the target. After the diodes are discharged, either by photon-generated electron-hole pair from light coming from the right or by leakage, the electron beam can replenish the charge and current flows through the diode. This current is directly proportional to the number of photons that have fallen on the target and can be recorded as an output signal OS. When the diodes are fully charged, however, the electron beam can deposit no further charge and thus no signal is recovered from the target. A new spectrometer or Si vidicon camera device thus obtains.

The invention, as described above, is not to be construed as limited to the particular forms disclosed herein, since these are to be regarded as illustrative rather than restrictive. Various combinations, equivalent substitutions, or other modifications of the preferred embodiments described herein are obviously possible in light of the description, without departing from the spirit of the invention. Accordingly, the invention is to be limited only as indicated by the scope of the appended claims:

I claim:

1. A method of making an active solid-state device comprising the steps of:
   forming a structure having microscopically small first phase bodies spaced from each other by second phase bodies, the bodies of at least one of the phases being a semiconductor substance, the first phase bodies physically contacting the second phase bodies but the structure being crystallographically discontinuous at the physical contact of the first phase bodies with the second phase bodies, said structure including electronic rectifying barriers at the physical contacts between said first phase bodies with said second phase bodies; and
   providing electrical contacts to selected locations of at least the bodies of one of the phases.

2. A method as in claim 1 where the forming step comprises the substeps of preparing a melt of at least two melt-segregating components at least one of which is the semiconductor substance and solidifying the melt to form in the melt a melt-segregation material comprising said structure having the first and second phase bodies.

3. A method as in claim 1 where the forming step comprises forming said electronic rectifying barriers as pn-junctions.

4. A method as in claim 1 where the forming step comprises forming said electronic rectifying barriers as metal-semiconductor barriers.

5. A method as in claim 1 where the forming step comprises forming the bodies of one of the phases of a device material having electronic conductivity which is at least one order of magnitude greater than that of the bodies of the other phase.

6. A method as in claim 1 where the forming step comprises the substeps of forming the first phase bodies of the semiconductor substance and choosing as the material of the second phase bodies a chemical element which is preferentially oxidizable over the semiconductor substance under the range of fractional to several atmospheric pressure of oxygen and at the temperature range between 0.3 to 0.75 $T_m$, where $T_m$ is the absolute melting temperature of the semiconductor substance; and including the additional step of preferentially oxidizing the chemical element within said temperature and pressure ranges to form oxide layers separating the semiconductor first phase bodies.

7. A method as in claim 1 where the forming step comprises forming the structure having microscopically thin, elongated and substantially parallel first phase bodies spaced from each other in a direction transverse to their lengths by second phase bodies, said forming being by unidirectional growth of said bodies in a direction along their lengths.

8. A method as in claim 7 where the forming step comprises condensing a vapor-state source material onto a substrate in the presence of a temperature gradient parallel to the direction of said unidirectional growth.

9. A method as in claim 7 where the forming step comprises forming the electronic rectifying barriers as pn-junctions oriented substantially perpendicular to the lengths of the bodies.

10. A method as in claim 7 where the forming step comprises forming the electronic rectifying barriers as pn-junctions extending along at least a major portion of the lengths of the bodies.

11. A method as in claim 7 including arranging the elongated and substantially parallel first phase bodies in uniformed arranged, multiple layers.

12. A method as in claim 7 where the forming step comprises the substeps of providing a growth substrate having a major surface; preparing a source of growth material containing the semiconductor substance; determining the unidirectional growth direction by applying a temperature gradient normal to the major surface; and from the growth material source growing the first phase bodies onto the major surface of the semiconductor substance in substantially pure form unidirectionally along the applied temperature gradient to form a polycrystalline, columnar array structure in which the semiconductor first phase bodies are spaced from each other and stand on their longitudinal ends on the major surface, and forming said second phase bodies in the spaces between the columnar, first phase bodies.

13. A method of making an active solid-state device comprising the steps of:

forming a structure having microscopically small first phase bodies which are physically contacted and are spaced from each other by second phase bodies, the bodies of at least one of the phases being a semiconductor substance, said forming step including the substeps of forming, at the physical contact of the first with the second phase bodies, electronic interfacial rectifying barrier regions having the property of converting between a flow of radiation photons in a selected direction and an electrical potential across the rectifying barrier regions; and terminating at least a plurality of the first phase bodies in a common termination surface exposed to the ambient; and providing electrical contacts across said rectifying barrier regions.

14. A method as in claim 13 where the forming step comprises forming the structure having microscopically thin, elongated and substantially parallel first phase bodies spaced from each other in a direction transverse to their lengths by said second phase bodies.

15. A method as in claim 14 where the forming step comprises forming the bodies of one of the phases of p-type semiconductor substance and forming the bodies of the other phase of n-type semiconductor substance, said rectifying barrier regions being pn-junction regions at the physical contacts of said p- and n-type semiconductor substances, and including the additional step of selectively removing portions of one of the p- and n-type semiconductor substances to form a surface of said one of the semiconductor substances from which portions of the other semiconductor substance protrude into the ambient in the direction along which said phase bodies are elongated.

16. A method as in claim 15 includng the additional step of fitting the tips of a bundle of matching optical fibers into the recesses between the protruded surface portions formed of said other semiconductor substance.

17. A method as in claim 14 including the additional step of slotting the structure transverse to the elongated phase bodies to divide the structure into two physically integral, electrically isolated portions which are spaced from, but face, each other.

* * * * *

UNITED STATES PATENT OFFICE
CERTIFICATE OF CORRECTION

Patent No. 4,136,435                    Dated Jan. 30, 1979

Inventor(s)     Chou H. Li

It is certified that error appears in the above-identified patent and that said Letters Patent are hereby corrected as shown below:

Col. 3, line 34, "grom" should read --from--. Col. 5, line 66, "euutectic" should read --eutectic--. Col. 6, line 13, "may" should read --many--. Col. 8, line 39, "for" should read --but--. Col. 9, line 32, "beans" should read --beams--. Col. 11, line 15, "Weiss' Weiss'" should read --Weiss'--. Col. 12, line 32, "each" should read --each into--; and line 63, "to electrical" should read --electrical--. Col. 13, line 2, "outgoin" should read --outgoing--; and line 27, "$c_p$" should read --c --.
and "kG" should read -- -kG--. Col. 15, line 57, "are" should read ---under--. Col. 16, line 12, "i a" should read --in a--. Col. 17, line 10, "PP'QQ " should read --PP'Q'Q-- and line 14, "DG" should read --OG--.

Signed and Sealed this

Seventeenth Day of June 1980

[SEAL]

Attest:

SIDNEY A. DIAMOND

Attesting Officer             Commissioner of Patents and Trademarks